US011454887B2

(12) United States Patent
Pandey

(10) Patent No.: US 11,454,887 B2
(45) Date of Patent: Sep. 27, 2022

(54) METROLOGY APPARATUS AND METHOD FOR DETERMINING A CHARACTERISTIC OF ONE OR MORE STRUCTURES ON A SUBSTRATE

(71) Applicant: ASML Netherlands B.V., Veldhoven (NL)

(72) Inventor: Nitesh Pandey, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 336 days.

(21) Appl. No.: 16/556,709

(22) Filed: Aug. 30, 2019

(65) Prior Publication Data

US 2020/0081340 A1  Mar. 12, 2020

(30) Foreign Application Priority Data

Sep. 12, 2018 (EP) .................................... 18193998

(51) Int. Cl.
*G03F 7/00* (2006.01)
*G03F 7/20* (2006.01)

(52) U.S. Cl.
CPC .......... *G03F 7/0035* (2013.01); *G03F 7/7065* (2013.01); *G03F 7/70341* (2013.01); *G03F 7/70466* (2013.01); *G03F 7/70633* (2013.01)

(58) Field of Classification Search
CPC ............... G03F 7/0035; G03F 7/70341; G03F 7/70466; G03F 7/70633; G03F 7/7065; G03F 7/70616; G01N 21/956

(Continued)

(56) References Cited

U.S. PATENT DOCUMENTS 6,952,253 B2   10/2005   Lof et al.
2009/0153825 A1   6/2009   Edart et al.
(Continued)

FOREIGN PATENT DOCUMENTS

EP   1628164 A2   2/2006
EP   3480554 A1   5/2019
(Continued)

OTHER PUBLICATIONS

Harwit, et al., "Chapter 1—An Introduction to Optical Multiplexing Techniques," Hadamard Transform Optics (1979); pp. 1-19.
(Continued)

*Primary Examiner* — Caleen O Sullivan
(74) *Attorney, Agent, or Firm* — Sterne, Kessler, Goldstein & Fox P.L.L.C.

(57) ABSTRACT

Disclosed is a method and associated inspection apparatus for measuring a characteristic of interest relating to a structure on a substrate. The inspection apparatus uses measurement radiation comprising a plurality of wavelengths. The method comprises performing a plurality of measurement acquisitions of said structure, each measurement acquisition being performed using measurement radiation comprising a different subset of the plurality of wavelengths, to obtain a plurality of multiplexed measurement signals. The plurality of multiplexed measurement signals are subsequently de-multiplexed into signal components according to each of said plurality of wavelengths, to obtain a plurality of de-multiplexed measurement signals which are separated according to wavelength.

14 Claims, 6 Drawing Sheets

(58) Field of Classification Search
USPC .......................................................... 430/30
See application file for complete search history.

(56) References Cited

U.S. PATENT DOCUMENTS

| | | |
|---|---|---|
| 2010/0328655 A1 | 12/2010 | Den Boef |
| 2011/0026032 A1 | 2/2011 | Den Boef et al. |
| 2011/0073775 A1 | 3/2011 | Setija et al. |
| 2011/0102753 A1 | 5/2011 | Van De Kerkhof et al. |
| 2011/0249244 A1 | 10/2011 | Leewis et al. |
| 2012/0044470 A1 | 2/2012 | Smilde et al. |
| 2016/0161863 A1 | 6/2016 | Den Boef et al. |
| 2016/0370717 A1 | 12/2016 | Den Boef et al. |
| 2017/0255104 A1* | 9/2017 | Polo ....................... G01B 11/00 |
| 2018/0011029 A1* | 1/2018 | Tinnemans ............. G02F 1/353 |
| 2020/0041563 A1* | 2/2020 | Tinnemans ............. G03F 7/705 |

FOREIGN PATENT DOCUMENTS

| | | |
|---|---|---|
| WO | WO 2011012624 A1 | 2/2011 |
| WO | WO 2017186483 A1 | 11/2017 |

OTHER PUBLICATIONS

Nitzsche, et al., "Noise, Fluctuation, and HADAMARD-Transform Spectrometry," Fluctuations and Noise in Photonics and Quantum Optics, Proceedings of SPIE, vol. 5111 (May 16, 2003); pp. 273-282.

Schaeberle, et al., "Multiplexed Acousto-Optic Tunable Filter (AOTF) Spectral Imaging Microscopy," Visual Communications and Image Processing, vol. 2173 (Feb. 9, 1994); pp. 11-20.

Turner, et al., "Near-Infrared Acousto-Optic Tunable Filter Hadamard Transform Spectroscopy," Applied Spectroscopy, The Society for Applied Spectroscopy, vol. 50, No. 2 (Feb. 1, 1996); pp. 277-284.

* cited by examiner

METROLOGY APPARATUS AND METHOD FOR DETERMINING A CHARACTERISTIC OF ONE OR MORE STRUCTURES ON A SUBSTRATE

FIELD

The present invention relates to a metrology apparatus or an inspection apparatus for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD=k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

In some cases, the signals to be measured are weak such that additive noise, for example detector noise, becomes dominant in the measurements. This is particularly relevant for Infra-red applications on 3D (high aspect ratio) structures such as 3D X-point and 3D-NAND. In such applications, the inherent signal is very weak due to the presence of opaque thin film layers. Additionally, image sensors based on InGaAs technology have a relatively large amount of thermal noise compared to visible Silicon based detectors.

The noise in an overlay signal comes from many factors, but there are three particularly important contributors: stray light, shot noise and additive signal independent detector noise. Of these, in certain system architectures, the signal-to-noise ratio (SNR) is primarily dominated by the detector noise. For Infrared applications, detector noise is typically reduced by cooling the detector using thermoelectric cooling and dissipating the heat using water pipes. This increases the cost and volume of the detector. In current overlay metrology schemes using the visible wavelengths, multiple wavelengths are used to improve accuracy. These measurements are performed sequentially. To extrapolate the trends in visible overlay sensing, multiple IR wavelengths are desirable. It is desirable to reduce the influence of the detector noise in order to improve metrology performance.

SUMMARY

It is an object to provide an effective an efficient solution for an inspection or metrology apparatus that solves one or more of the above discussed problems or limitations.

Embodiments of the invention are disclosed in the claims and in the detailed description.

In a first aspect of the invention there is provided a method for measuring a characteristic of interest relating to a structure on a substrate, and/or method for inspecting a structure on a substrate, with measurement radiation comprising a plurality of wavelengths, the method comprising: performing a plurality of measurement acquisitions of said structure, each measurement acquisition being performed using measurement radiation comprising a different subset of the plurality of wavelengths, to obtain a plurality of multiplexed measurement signals; and de-multiplexing the plurality of multiplexed measurement signals into signal components according to each of said plurality of wavelengths, to obtain a plurality of de-multiplexed measurement signals which are separated according to wavelength.

In a second aspect of the invention there is provided an inspection apparatus comprising: a substrate holder for holding a substrate comprising a structure, a radiation source operable to generate measurement radiation comprising a plurality of wavelengths; projection optics for projecting the measurement radiation onto the structure; a detector for detecting a plurality of multiplexed measurement signals following scattering by the structure, each multiplexed measurement signal being the result of a measurement acquisition performed each time with the measurement radiation comprising a different subset of the plurality of wavelengths; and a processor operable to de-multiplex the plurality of multiplexed measurement signals into signal components according to each of said plurality of wavelengths, to obtain a plurality of de-multiplexed measurement signals which are separated according to wavelength.

In a third aspect of the invention, there is provided a litho cell comprising: an inspection apparatus according to the second aspect; and a lithography apparatus operable to apply a pattern on a substrate.

Also provided is a computer program operable to carry out the method of the first aspect.

BRIEF DESCRIPTION OF THE DRAWINGS

Embodiments of the invention will now be described, by way of example only, with reference to the accompanying schematic drawings, in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
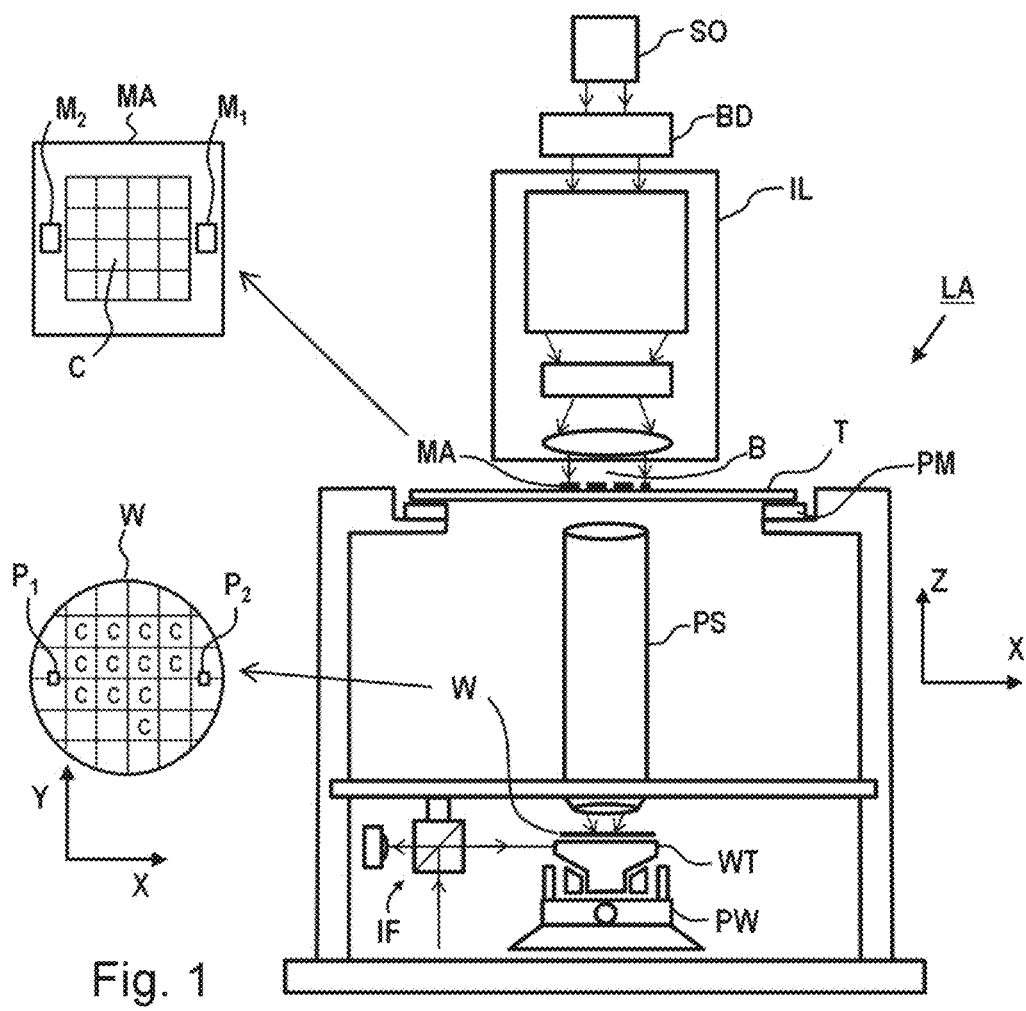
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
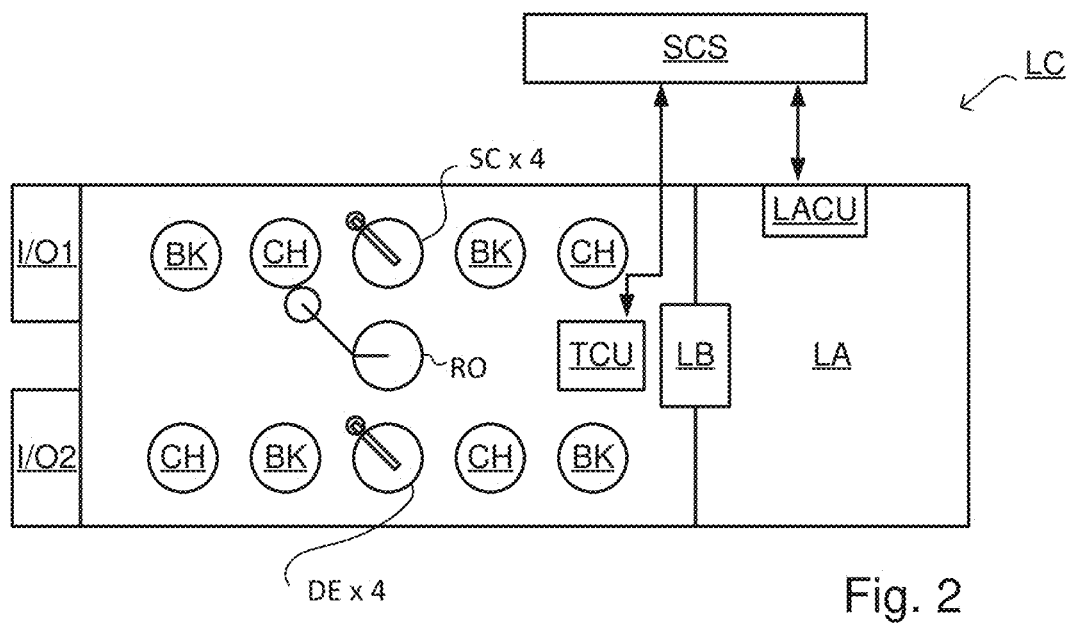
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DIE to develop exposed resist, chill plates CH and bake plates BK, e.g. for conditioning the temperature of substrates W e.g. for conditioning solvents in the resist layers. A substrate handler, or robot, RU picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
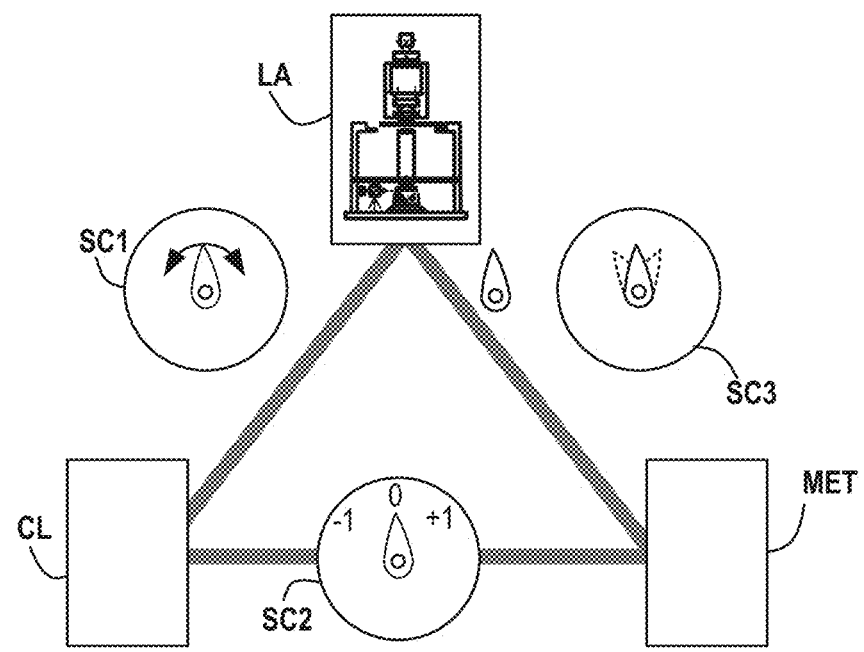
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US2011102753A1, US20120044470A, US20110249244, US20110026032 or EP1,628,1.64A, incorporated herein by reference in their entirety. Aforementioned scatterometers can measure in one image multiple targets from multiple gratings using light from soft x-ray and visible to near-IR wave range.

Figure 4:
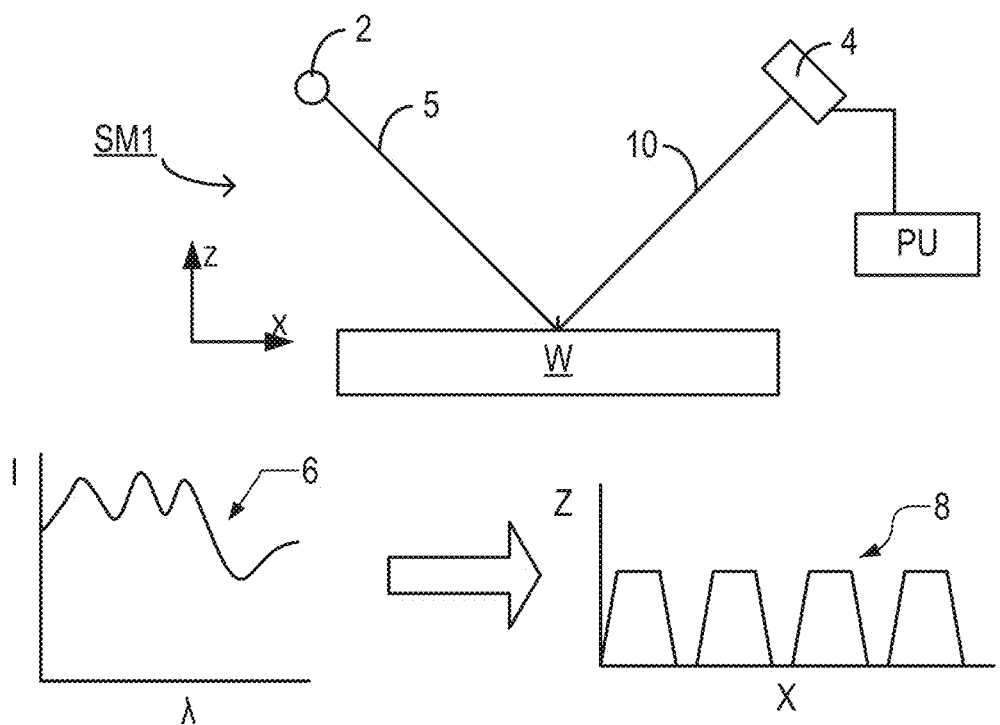
FIG. 4 illustrates an inspection apparatus according to an embodiment of the invention.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6 (i.e. a measurement of intensity I as a function of wavelength λ) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Figure 5A:
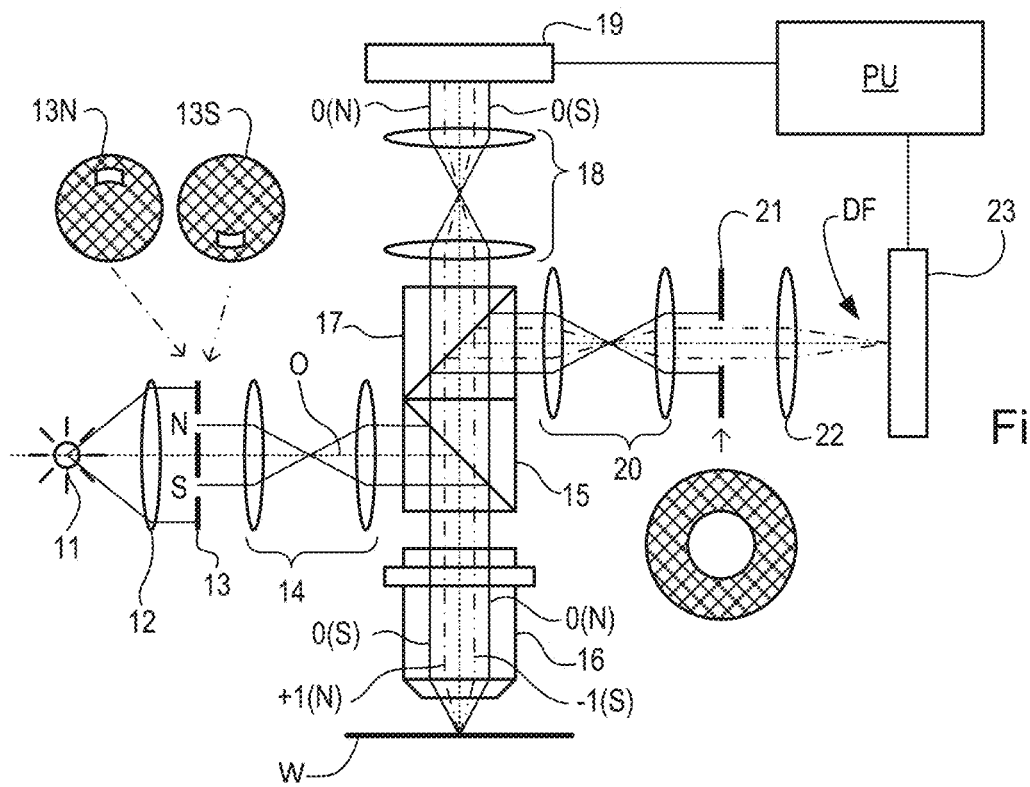
FIGS. 5(a)-5(d) comprise 5(a) a schematic diagram of a dark field scatterometer for use in measuring targets according to embodiments of the invention using a first pair of illumination apertures, 5(b) a detail of diffraction spectrum of a target grating for a given direction of illumination 5(c) a second pair of illumination apertures providing further illumination modes in using the scatterometer for diffraction based overlay measurements and 5(d) a third pair of illumination apertures combining the first and second pair of apertures.

A metrology apparatus suitable for use in embodiments of the invention is shown in FIG. 5(a). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, light emitted by source 11 is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

Source 11 is capable of generating illumination radiation having a plurality of selectable wavelengths. For example, source 11 may comprise one or more broadband radiation sources and one or more controllable wavelength filters to selectively allow transmission of certain wavelengths to the optical system. The one or more wavelength filters may comprise, for example, one or more acousto-optical tunable filters (AOTFs). Processor unit PU may control the source 11 and/or the controllable wavelength filters.

Figures 5B, 5C, 5D:
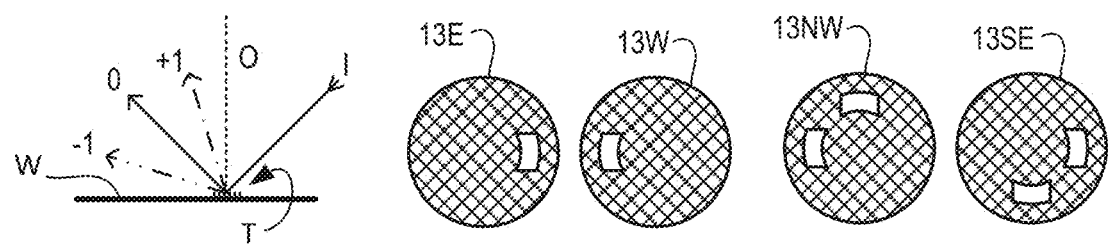

As shown in FIG. 5(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line O) and two first order rays (dot-chain line+1 and double dot-chain line−1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled I(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples, in another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS. 3(c) and (d). The use of these, and numerous other variations and applications of the apparatus are described in prior published applications, mentioned above.

Figure 6A:
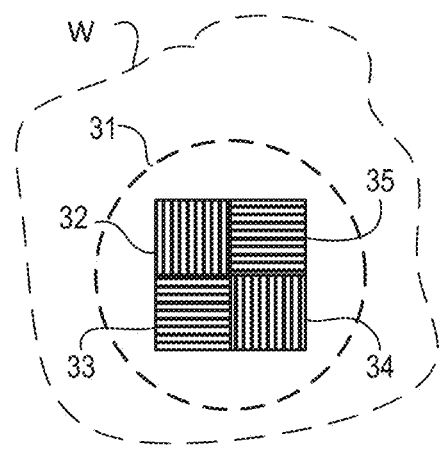
FIGS. 6(a)-6(b) depict 6(a) a known form of multiple grating target and an outline of a measurement spot on a substrate; and 6(b) an image of the target obtained in the scatterometer of FIGS. 5(a)-5(d)

FIG. 6(a) depicts a target structure or composite target formed on a substrate according to known practice. The target structure in this example comprises four targets (e.g., gratings) 32 to 35 positioned closely together so that they will all be within a measurement spot 31 formed by the metrology radiation illumination beam of the metrology apparatus. The four targets thus are all simultaneously illuminated and simultaneously imaged on sensors 19 and 23. In an example dedicated to measurement of overlay, targets 32 to 35 are themselves composite gratings formed by overlying gratings that are patterned in different layers of the semi-conductor device formed on substrate W. Targets 32 to 35 may have differently biased overlay offsets in order to facilitate measurement of overlay between the layers in which the different parts of the composite gratings are formed. The meaning of overlay bias will be explained below with reference to FIG. 7. Targets 32 to 35 may also differ in their orientation, as shown, so as to diffract incoming radiation in X and Y directions. In one example, targets 32 and 34 are X-direction gratings with biases of the +d, −d, respectively. Targets 33 and 35 are Y-direction gratings with offsets +d and −d respectively. Separate images of these gratings can be identified in the image captured by sensor 23. This is only one example of a target structure. A target structure may comprise more or fewer than 4 targets, or only a single target.

Figure 6B:
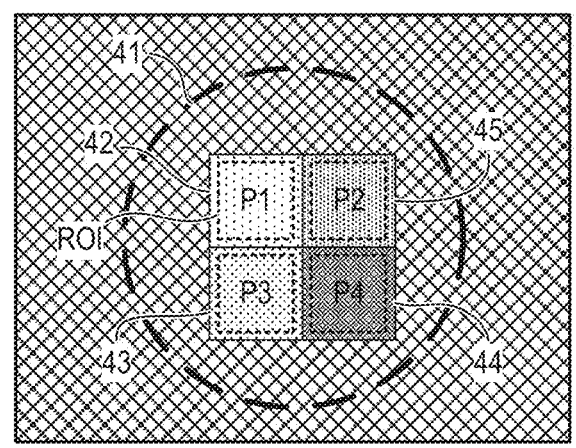

FIG. 6(b) shows an example of an image that may be formed on and detected by the sensor 23, using the target of FIG. 6(a) in the apparatus of FIG. 5, using the aperture plates 13NW or 13SE from FIG. 5(d). While the pupil plane image sensor 19 cannot resolve the different individual targets 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of targets 32 to 35. In this way, the images do not have to be aligned very precisely at a specific location within the sensor frame, which greatly improves throughput of the measuring apparatus as a whole.

Once the separate images of the targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

In one embodiment of the metrology apparatus (e.g., scatterometer), the metrology apparatus is adapted to measure the overlay of two misaligned gratings or periodic structures by measuring asymmetry in the reflected spectrum and/or the detection configuration, the asymmetry being related to the extent of the overlay. A similar method may be used to measure focus on special targets which are formed with a focus dependent asymmetry. In the overlay case, the two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

For diffraction based overlay (DBO) metrology, the overlay is derived using only intensity information from radiation diffracted by stacked gratings. This yields a measurement sensitivity that is highly wavelength dependent, due to the wavelength dependent refractive index of the stack being measured and the thin film structure present in the stack. This wavelength dependency, often described by a swing curve, is also highly dependent on the composition and thickness of the stack which results in a process-robustness challenge. For this reason, amongst others, measuring with a larger wavelength range (e.g., from DUV to IR) may be desired to deal with challenging stacks and applications. In such embodiments, the intensity in the diffracted orders is measured, at multiple wavelengths and the overlay values are extracted.

Figure 7:
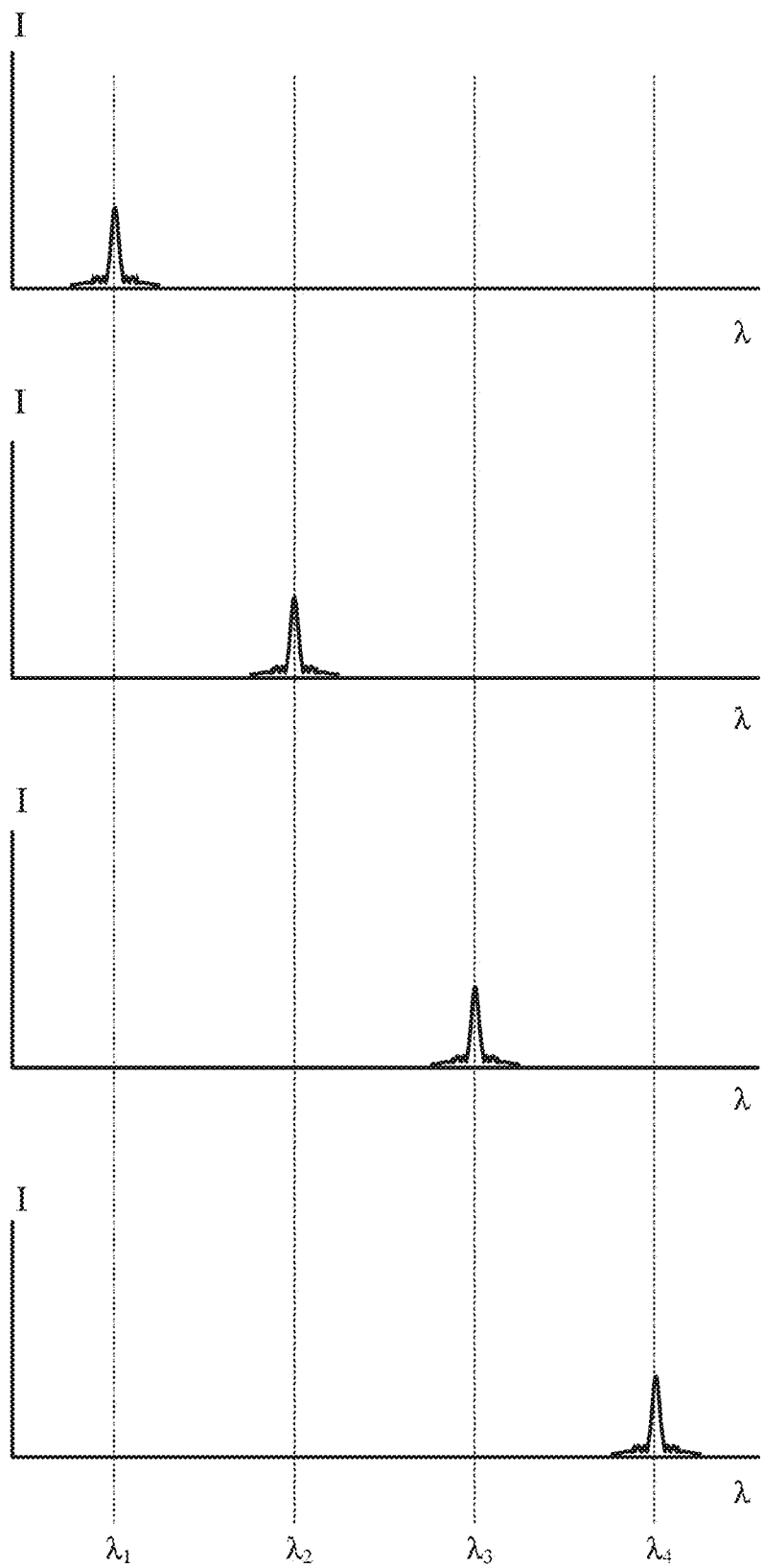
FIG. 7 depicts conceptually a sequential multi-wavelength metrology method according to known principles
Figure 7:
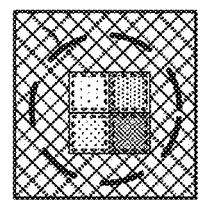
Figure 7:
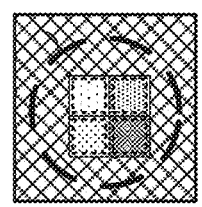
Figure 7:
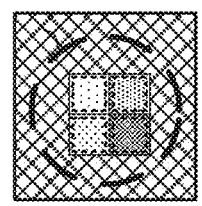
Figure 7:
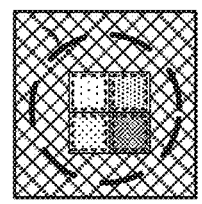

Conventionally a multi-wavelength overlay measurement is performed sequentially by switching the wavelengths at the source and capturing an image for each wavelength. Each measurement is therefore independent of all the others. FIG. 7 conceptually illustrates such a sequential method. This Figure shows four plots of intensity I against wavelength $\lambda$ for the measurement radiation used for each acquisition. In this sequential method, each of the spectra comprises (substantially) a different single wavelength $\lambda_1$, $\lambda_2$, $\lambda_3$, $\lambda_4$ only. The Figure also shows a corresponding image $I_{\lambda 1}$, $I_{\lambda 2}$, $I_{\lambda 3}$, $I_{\lambda 4}$ (e.g., images each similar to that illustrated in FIG. 6(b)) captured for each wavelength $I_{\lambda 1}$, $I_{\lambda 2}$, $I_{\lambda 3}$, $I_{\lambda 4}$. In such a method, for N wavelengths, the sensor noise is introduced N times.

A metrology method is proposed herein which can improve the signal-to-noise ratio (SNR) of the intended multi-wavelength measurement when additive sensor noise is dominant. The method comprises performing multiplexed measurements, each measurement being performed using radiation comprising a different subset of the plurality of wavelengths and de-multiplexing the measurements according to individual wavelengths. More specifically, the method comprises measuring a characteristic of interest relating to a structure with measurement radiation comprising a plurality of wavelengths, the measurement comprising performing a plurality multi-wavelength measurement acquisitions where, for each acquisition, a smaller subset of the plurality of wavelengths are used (usually greater than one, although a measurement with a single wavelength is possible). The total number of acquisitions will be the same as the total number of wavelengths used over the acquisitions. The number of acquisitions performed in total corresponds with the total number of wavelengths used across the acquisitions, with each acquisition using a different (e.g., multiple wavelength) subset of the total number of wavelengths simultaneously. Various combinations of wavelengths are determined for each acquisition using special multiplexing codes. The number of wavelengths per acquisition can be varied. The acquired signals can then be digitally de-multiplexed to obtain the individual signals for each of the wavelengths used.

A main advantage of such an approach is that, while the net sensor noise introduced in the measurements is the same as for the sequential measurement scheme illustrated in FIG. 7, the signal is increased by a factor based on the subset size. For example, if each subset comprise M wavelengths, the signal is increased by a factor of M. This is referred to as the 'multiplexing' advantage in spectroscopy. Hadamard transform spectroscopy is an example of this type of spectroscopy. While the methods described herein are not limited to any particular wavelength(s) or metrology techniques, the methods may be particularly useful for infrared overlay metrology (e.g., wherein at least one of the plurality of wavelengths is in the infrared range, where the infrared range may be defined as any of the following ranges: 200-2000 nm, 300-1500 nm, 400-1000 nm or 700 nm-1000 nm) because:

- The detected signals are inherently weaker and thus the noise is sensor noise dominated.
- The IR sensor (InGaAs) is very noisy, adding significant sensor noise.
- In methods using computational imaging techniques (such as described below), AOTFs (acousto-optical tunable filters) are already typically used; these are suitable for creating multiplexed spectra.

Figure 8:
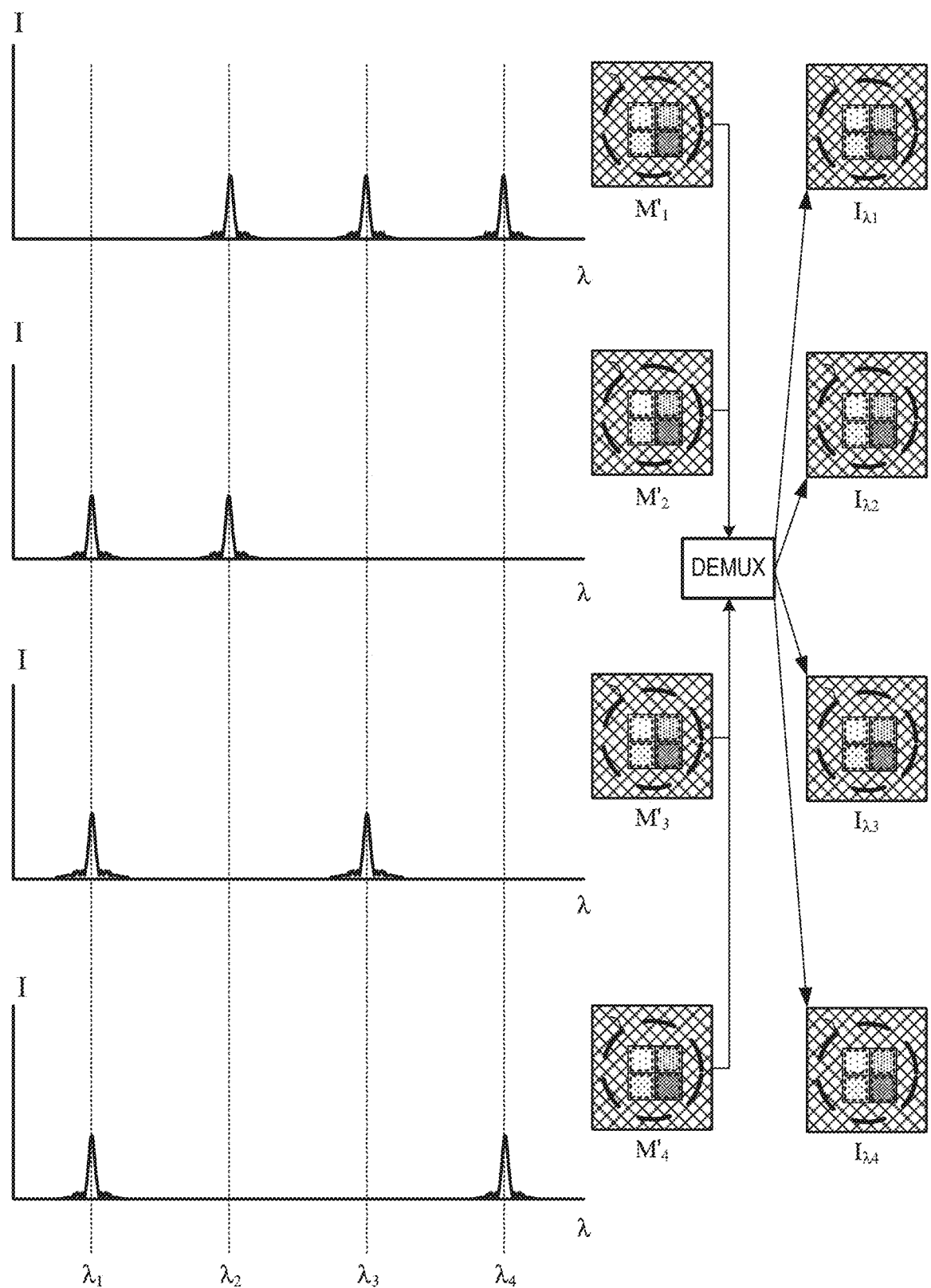
FIG. 8 depicts conceptually a multiplexed multi-wavelength metrology method according to an embodiment of the invention.

FIG. 8 conceptually illustrates how multiplexing techniques can be used to improve SNR for multi-wavelength (e.g., Infrared) metrology. The Figure shows four plots of intensity I against wavelength for four acquisitions, and a corresponding measurement signal $M_1$, $M_2$, $M_3$, $M_4$ (e.g., captured images or parameter values, such as intensity, therefrom) obtained in each acquisition. It can be seen from the spectrum plots that each acquisition is captured using a different subset of wavelengths. A decoding step DEMUX is performed based on the images $M_1$, $M_2$, $M_3$, $M_4$, to obtain measurement signals (e.g., intensity metrics or values) $I_{\lambda 1}$, $I_{\lambda 2}$, $I_{\lambda 3}$, $I_{\lambda 4}$ for each of the wavelengths used $\lambda_1$, $\lambda_2$, $\lambda_3$, $\lambda_4$.

For the four measurement spectra illustrated, the corresponding four measurement signals $M_1$, $M_2$, $M_3$, $M_4$ (e.g., combined intensities from multiple wavelengths as captured on the sensor) can each be represented as:

$$M_1 = I_{\lambda 2} + I_{\lambda 3} + I_{\lambda 4} + E_1$$

$$M_2 = I_{\lambda 1} + I_{\lambda 4} + E_2$$

$$M_3 = I_{\lambda 1} + I_{\lambda 3} + E_3$$

$$M_4 = I_{\lambda 1} + I_{\lambda 4} + E_4$$

where $E_1$, $E_2$, $E_3$, $E_4$ represents the additive noise introduced by the sensor for each measurement. The error variance is $\sigma^2$.

Consider now the numerical retrieval of the image $I_{\lambda 1}$ at the first wavelength $\lambda_1$. The noisy retrieved image $I'_{\lambda 1}$ for wavelength $\lambda 1$ can be seen to be:

$$I'_{\lambda 1} = (-M_1 + M_2 + M_3 + M_4)/3 = I_{\lambda 1} + (-E_1 + E_2 + E_3 + E_4)/3$$

Therefore the total sensor noise component (error signal) is: $(E_1 + E_2 E_3 + E_4)/3$. The variance of this new error is $4\sigma^2/9$. Thus the error decreases by more than 50%. Similarly, the variance of the error at the other three wavelengths can be shown to be $7\sigma^2/9$. The reason for the error reduction is that more than one measurement is obtained for each wavelength (nine measurements total) while the sensor is still used only the four times (four acquisitions and therefore four consequent additive sensor noise components). This simple example shows how multiplexing wavelengths can be used to reduce the error.

A Hadamard multiplexing embodiment will now be described. The Hadamard transform technique superposes signals according to their transformation matrix. The original signals are calculated from the multiplexed signals by the inverse of this transformation. The number of measurements (i.e. of the multiplexed signals) agrees with the number of the original signals. To better understand this embodiment, the conventional sequential methodology at N different wavelengths will be described initially, using matrix notation.

If $I_{\lambda i}$ represents the image signal at wavelength $\lambda_i$, the measurement signals $M_i$ can be represented in matrix form as $M = F \times I_\lambda$, where F is the N×N identity matrix. For N=7:

$$F = \begin{matrix} 1 & 0 & 0 & 0 & 0 & 0 & 0 \\ 0 & 1 & 0 & 0 & 0 & 0 & 0 \\ 0 & 0 & 1 & 0 & 0 & 0 & 0 \\ 0 & 0 & 0 & 1 & 0 & 0 & 0 \\ 0 & 0 & 0 & 0 & 1 & 0 & 0 \\ 0 & 0 & 0 & 0 & 0 & 1 & 0 \\ 0 & 0 & 0 & 0 & 0 & 0 & 1 \end{matrix}$$

Matrix F can be interpreted such that each row corresponds to a measurement $M_i$ and each column represents a different wavelength $\lambda_1$ to $\lambda_7$ (or vice versa). In such an interpretation, the elements of matrix F indicate the presence of a wavelength in the measurement spectrum used to obtain the corresponding measurement signal $M_i$: a 1 indicates a wavelength $\lambda_i$ is present and a 0 represents a wavelength $\lambda_i$ is absent. It can be seen here that each measurement comprises a single wavelength, with each of the wavelengths cycled through sequentially.

In the proposed embodiment, the identity matrix F is replaced by a circulant (cyclic) multiplexing matrix F' based on application of a Hadamard code, where each row is a circulant shift of the Hadamard code. A circulant matrix is completely determined by its first row, all other rows following from the first one by circulant permutations. More information on this approach can be found in the following publication which is herein incorporated by reference: Nitzsche, Günter, and Rainer Riesenberg. "Noise, fluctuation, and HADAMARD-transform spectrometry," *SPIE's First International Symposium on Fluctuations and Noise*. International Society for Optics and Photonics.

Application of the multiplexing matrix F' on image $I_{\lambda i}$ results in a Hadamard transformation of the image $I_{\lambda i}$. An example of the multiplexing matrix F' may take the form:

$$F' = \begin{pmatrix} 1 & 1 & 1 & 0 & 1 & 0 & 0 \\ 1 & 1 & 0 & 1 & 0 & 0 & 1 \\ 1 & 0 & 1 & 0 & 0 & 1 & 1 \\ 0 & 1 & 0 & 0 & 1 & 1 & 1 \\ 1 & 0 & 0 & 1 & 1 & 1 & 0 \\ 0 & 0 & 1 & 1 & 1 & 0 & 1 \\ 0 & 1 & 1 & 1 & 0 & 1 & 0 \end{pmatrix}$$

Once again, the matrix can be interpreted such that each row corresponds to a measurement signal M'$_i$ and each column represents a different wavelength $\lambda_1$ to $\lambda_7$ (or vice versa), such that a 1 indicates that a wavelength $\lambda_i$ is present in, and a 0 represents that a wavelength $\lambda_1$ is absent from, the measurement spectrum used to obtain measurement signal M'$_i$. Therefore, in the multiplexing scheme using this multiplexing matrix F', each measurement signal M'$_i$ is a superposition of signals corresponding to four different measurement wavelengths (e.g., measurement image M'$_1$ represented by row 1 comprises a sum of the detected signals following a single measurement acquisition using radiation comprising wavelengths $\lambda_1$, $\lambda_2$, $\lambda_3$, $\lambda_3$, i.e., $$M'_1 = I_{\lambda,1} + I_{\lambda,2} + I_{\lambda,5}$$

The de-multiplexing matrix D is given by:

$$D = \begin{pmatrix} 0.25 & 0.25 & 0.25 & -0.25 & 0.25 & -0.25 & -0.25 \\ 0.25 & 0.25 & -0.25 & 0.25 & -0.25 & -0.25 & 0.25 \\ 0.25 & -0.25 & 0.25 & -0.25 & -0.25 & 0.25 & 0.25 \\ -0.25 & 0.25 & -0.25 & -0.25 & 0.25 & 0.25 & 0.25 \\ 0.25 & -0.25 & -0.25 & 0.25 & 0.25 & 0.25 & -0.25 \\ -0.25 & -0.25 & 0.25 & 0.25 & 0.25 & -0.25 & 0.25 \\ -0.25 & 0.25 & 0.25 & 0.25 & -0.25 & 0.25 & -0.25 \end{pmatrix}$$

It can be appreciated that the product of the multiplexing matrix F' and de-multiplexing matrix D is the identity matrix F. Therefore the individual signals I$_{\lambda,j}$ can be decoded exactly from the multiplexed measurement signals M'$_i$.

From the multiplexing matrix F', it can be seen that each measurement is a sum of the signals from four different wavelengths and each wavelength is measured independently four times. However, the total number of measurements is the same as the sequential method and hence the acquisition time throughput is still equal to that of the sequential method.

It should be noted that the specific Hadamard transformation based multiplexing scheme described above is purely an example, and any other suitable multiplexing codes may be used instead. For example, an alternative scheme may be based on uniformly redundant arrays (URAs, such as those used to define mask patterns for coded aperture imaging, particularly in imaging systems with a cyclic coded mask), Hadamard Matrices or S-Matrices.

In an embodiment, the wavelength multiplexing is implemented using AOTFs. AOTFs can be used to output several discrete wavelength bands simultaneously. However, any other suitable implementation for achieving this can be used.

Figure 9:
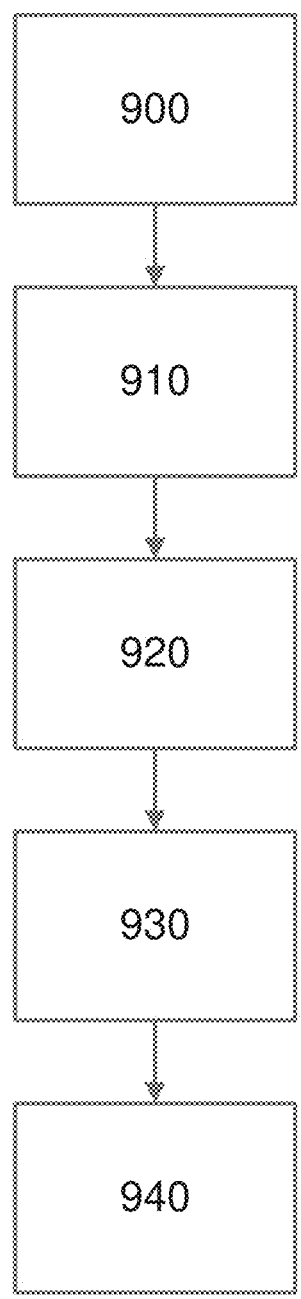
FIG. 9 is a flowchart of a method according to an embodiment of the invention.

FIG. 9 is a flowchart describing a method according to an embodiment of the invention. At step 900, a suitable multiplexing scheme is determined. This may comprise determining a multiplexing matrix based on a suitable coding method (e.g., Hadamard code or URAs). Multiplexing matrix F' above is an example of a suitable multiplexing matrix. At step 910, multiple measurement acquisitions are performed on a structure, such as an overlay target, in each case using measurement radiation having a spectrum chosen according to the multiplexing scheme, to obtain a plurality of multiplexed measurement signals. At step 930, a de-multiplexing step is performed based on the multiplexing scheme determined at step 900. This could be achieved by application of a de-multiplexing matrix D having a form such that the product of multiplexing matrix F' and de-multiplexing matrix D is an identity matrix. The output of this step is a plurality of de-multiplexed signals (images or parameter values such as intensity) separated in terms of wavelength used. At step 940, a parameter of interest (e.g., overlay, focus, dose, edge placement error, side wall angle, critical dimension or any other dimension) is calculated from the plurality of de-multiplexed signals. Such a method may be implemented by a processor unit (e.g., processor unit PU of FIG. 5(a)). The processor unit may also control the illumination source and/or the controllable wavelength filters (AOTF) in dependence of the selected multiplexing scheme.

Compared to sequential methods typically performed at present, the impact of additive white Gaussian noise (AWGN noise), such as detector noise, is decreased by a factor $(N+1)/2\sqrt{N}$ where N is the length of the code, using methods such as those described herein. In the example shown above, the noise $\sigma$ improvement is by a factor of 1.5. For applications where detector noise is dominant (eg. IR overlay), such a scheme can achieve a significantly improved SNR. The advantage will increase as more wavelengths are measured.

It should be appreciated, however, that when signal dependent noise is dominant, this improvement is diminished. The improvement of SNR depends on the ratio of photon noise to the additive detector noise. In the situation where photon noise is dominant, such a scheme offers no advantage and can even be disadvantageous.

Detector noise is the dominant noise contributor in Computational Imaging (CI) inspection systems. Therefore, the techniques described herein are particularly suited to such systems. Additionally, AOTFs, which are suited for multiplexing the different wavelengths to obtain the measurement subsets, are typically already present in such CI inspection systems. Computational Imaging in the context of lithography metrology is described in patent application EP17199764, which is incorporated herein by reference. In CI, the high-quality and high-NA imaging optics are replaced by a simple single lens, for example, which creates a relatively distorted and aberrated image of the metrology target(s) on an image sensor. A near-perfect image of metrology targets can be retrieved when the full field (both intensity and phase) of the light on the sensor is known by direct phase resolved measurements (e.g. holographic microscopy) or by phase retrieval methods (phase is retrieved from intensity measurements only). In phase resolved measurements, the far field phase distribution of the light scattered on the sensor can be observed by using a holographic setup. Phase retrieval methods may use a phase retrieval algorithm and prior knowledge relating to the imaging system and/or the metrology targets. Examples of suitable phase retrieval methods have been described in the aforementioned patent application EP17199764.6 filed on Nov. 2, 2017.

Further embodiments are disclosed in the subsequent numbered clauses:

1. A method for measuring a characteristic of interest relating to a structure on a substrate with measurement radiation comprising a plurality of wavelengths, the method comprising:

performing a plurality of measurement acquisitions of said structure, each measurement acquisition being performed using measurement radiation comprising a different subset of the plurality of wavelengths, to obtain a plurality of multiplexed measurement signals; and de-multiplexing the plurality of multiplexed measurement signals into signal components according to each of said plurality of wavelengths, to obtain a plurality of de-multiplexed measurement signals which are separated according to wavelength.

2. A method as defined in clause 1, wherein each subset of the plurality of wavelengths numbers more than one and fewer than the number of said plurality of wavelengths.

3. A method as defined in clause 1 or 2, wherein the wavelengths comprised within each subset of the plurality of wavelengths is determined using a multiplexing code suitable for enabling their subsequent de-multiplexing according to wavelength.

4. A method as defined in clause 3, wherein said multiplexing code is based on a Hadamard code, a uniformity redundant array code, or a code based on Hadamard matrices or S-matrices.

5. A method as defined in clause 3 or 4 wherein the multiplexing code defines a multiplexing matrix such that each one of a row or column of a multiplexing matrix describes each of said subsets of the plurality of wavelengths.

6. A method as defined in clause 5, wherein each element of each of said rows or columns of the multiplexing matrix indicates the presence or absence of a particular one of the plurality of wavelengths in each subset of the plurality of wavelengths.

7. A method as defined in clause 5 or 6, wherein said de-multiplexing step is performed by application of a de-multiplexing matrix, having a form such that the product of the multiplexing matrix and de-multiplexing matrix is an identity matrix.

8. A method as defined in any of clauses 5 to 7, wherein said multiplexing matrix comprises a circulant matrix.

9. A method as defined in any preceding clause, wherein the wavelength multiplexing is achieved using one or more acousto-optical tunable filters.

10. A method as defined in any preceding clause, wherein the multiplexed measurement signals and de-multiplexed measurement signals each describe an intensity metric detected on a detector, each multiplexed measurement signal corresponding to a superposition of its constituent de-multiplexed measurement signals.

11. A method as defined in any preceding clause, wherein said multiplexed measurement signals is obtained using a computational imaging algorithm which determines a phase of the multiplexed measurement signals.

12. A method as defined in any preceding clause, wherein any noise present in the multiplexed measurement signals is dominated by additive detector noise introduced by a detector used to detect the multiplexed measurement signals.

13. A method as defined in any preceding clause, wherein at least one of the plurality of wavelengths is in the infrared range.

14. A method as defined in any preceding clause, wherein said characteristic of interest comprises overlay, edge placement error, lie edge roughness or focus of a lithographic apparatus being used to manufacture the structure, dose of the lithographic apparatus being used to manufacture the structure, side wall angle, critical dimension, a 3D profile of a portion of the structure.

15. A method for inspecting a structure on a substrate with measurement radiation comprising a plurality of wavelengths, the method comprising:

performing a plurality of measurement acquisitions of said structure, each measurement acquisition being performed using measurement radiation comprising a different subset of the plurality of wavelengths, to obtain a plurality of multiplexed measurement signals; and de-multiplexing the plurality of multiplexed measurement signals into signal components according to each of said plurality of wavelengths, to obtain a plurality of de-multiplexed measurement signals which are separated according to wavelength.

16. A non-transitory computer program product comprising machine-readable instructions for causing a processor to cause performance of the method as defined in any preceding clause.

17. An inspection apparatus operable to perform the method of any of clauses 1 to 15.

18. An inspection apparatus comprising:

a substrate holder for holding a substrate comprising a structure a radiation source operable to generate measurement radiation comprising a plurality of wavelengths;

projection optics for projecting the measurement radiation onto the structure;

a detector for detecting a plurality of multiplexed measurement signals following scattering by the structure, each multiplexed measurement signal being the result of a measurement acquisition performed each time with the measurement radiation comprising a different subset of the plurality of wavelengths; and a processor operable to de-multiplex the plurality of multiplexed measurement signals into signal components according to each of said plurality of wavelengths, to obtain a plurality of de-multiplexed measurement signals which are separated according to wavelength.

19. An inspection apparatus as defined in clause 18, wherein each subset of the plurality of wavelengths numbers more than one and fewer than the number of said plurality of wavelengths 20. An inspection apparatus as defined in clause 19, wherein the processor is operable such that the wavelengths comprised within each subset of the plurality of wavelengths is determined using a multiplexing code suitable for enabling their subsequent de-multiplexing according to wavelength.

21. An inspection apparatus as defined in clause 20, wherein said multiplexing code is based on a Hadamard code, a uniformity redundant array code, or a code based on Hadamard matrices or S-matrices.

22. An inspection apparatus as defined in clause 20 or 21, wherein the multiplexing code defines a multiplexing matrix such that each one of a row or column of a multiplexing matrix describes each of said subsets of the plurality of wavelengths.

23. An inspection apparatus as defined in clause 22, wherein each element of each of said rows or columns of the multiplexing matrix indicates the presence or absence of a particular one of the plurality of wavelengths in each subset of the plurality of wavelengths.

24. An inspection apparatus as defined in clause 22 or 23, wherein said processor is operable to perform said de-multiplexing by application of a de-multiplexing matrix, having a form such that the product of the multiplexing matrix and de-multiplexing matrix is an identity matrix.

25. An inspection apparatus as defined in any of clauses 22 to 24, wherein said multiplexing matrix comprises a circulant matrix.

26. An inspection apparatus as defined in any of clauses 18 to 25, wherein the radiation source comprises one or more broadband radiation sources, in combination with one or more controllable wavelength filters for selectively generating measurement radiation with different combinations of wavelengths.

27. An inspection apparatus as defined in clause 26, wherein said one or more controllable wavelength filters comprises one or more acousto-optical tunable filters operable to perform the wavelength multiplexing.

28. An inspection apparatus as defined in any of clauses 18 to 27, wherein the multiplexed measurement signals and de-multiplexed measurement signals each describe an intensity metric detected on the detector, each multiplexed measurement signal corresponding to a superposition of its constituent de-multiplexed measurement signals.

29. An inspection apparatus as defined in any of clauses 18 to 28, wherein the processor is operable to implement a computational imaging algorithm which determines a phase of the multiplexed measurement signals.

30. An inspection apparatus as defined in any of clauses 18 to 29, wherein any noise present in the multiplexed measurement signals is dominated by additive detector noise introduced by the detector.

31. An inspection apparatus as defined in any of clauses 18 to 30, wherein at least one of the plurality of wavelengths is in the infrared range.

32. An inspection apparatus as defined in any of clauses 18 to 31, wherein the processor is operable to determine a characteristic of interest from said plurality of de-multiplexed measurement signals.

33. An inspection apparatus as defined in clause 32 wherein said characteristic of interest comprises overlay, edge placement error, lie edge roughness or focus of a lithographic apparatus being used to manufacture the structure, dose of the lithographic apparatus being used to manufacture the structure, side wall angle, critical dimension, a 3D profile of a portion of the structure.

34. An inspection apparatus as defined in any of clauses 18 to 33 wherein the inspection apparatus is a metrology apparatus for measuring a characteristic of interest related to a structure on a substrate.

35. A litho cell comprising:
   an inspection apparatus according to any of clauses 18 to 34; and
   a lithography apparatus operable to apply a pattern on a substrate.

36. The litho cell of clause 35, comprising a processor operable to determine a correction for the application of pattern on a substrate based on measurements performed by the inspection apparatus.

While the above examples are described in terms of overlay, the invention is equally applicable to any measurement of a characteristic of interest which relates to process control monitoring of a lithographic process. Other characteristics of interest include focus or dose, for example by measuring targets which are exposed with a focus or dose dependent asymmetry which can be measured back and the exposure focus setting and/or dose determined therefrom. Other examples of a characteristic of interest for which the concepts herein are applicable are critical dimension (CD), side wall angle (SWA) or Edge Placement Error (EPE), the latter being a more complex form of overlay (i.e., a combination of overlay and critical dimension uniformity).

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g., the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A method for measuring a characteristic of interest relating to a structure on a substrate with measurement radiation comprising a plurality of wavelengths, the method comprising:
   performing a plurality of measurement acquisitions of the structure, each measurement acquisition being performed using measurement radiation comprising a different subset of the plurality of wavelengths, to obtain a plurality of multiplexed measurement signals; and
   de-multiplexing the plurality of multiplexed measurement signals into signal components according to each of the plurality of wavelengths, to obtain a plurality of de-multiplexed measurement signals that are separated according to wavelength,
   wherein each subset of the plurality of wavelengths numbers more than one and fewer than the number of the plurality of wavelengths.

2. The method of claim 1, wherein the wavelength multiplexing is achieved using one or more acousto-optical tunable filters.

3. The method of claim 1, wherein the multiplexed measurement signals and de-multiplexed measurement signals each describe an intensity metric detected on a detector, each multiplexed measurement signal corresponding to a superposition of its constituent de-multiplexed measurement signals.

4. The method of claim 1, wherein the multiplexed measurement signals are obtained using a computational imaging algorithm which determines a phase of the multiplexed measurement signals.

5. The method of claim 1, wherein any noise present in the multiplexed measurement signals is dominated by additive detector noise introduced by a detector used to detect the multiplexed measurement signals.

6. The method of claim 1, wherein the characteristic of interest comprises at least one selected from the group consisting of overlay, edge placement error, lie edge roughness or focus of a lithographic apparatus being used to manufacture the structure, dose of the lithographic apparatus being used to manufacture the structure, side wall angle, critical dimension, and a 3D profile of a portion of the structure.

7. A method for measuring a characteristic of interest relating to a structure on a substrate with measurement radiation comprising a plurality of wavelengths, the method comprising:
   performing a plurality of measurement acquisitions of the structure, each measurement acquisition being performed using measurement radiation comprising a different subset of the plurality of wavelengths, to obtain a plurality of multiplexed measurement signals; and
   de-multiplexing the plurality of multiplexed measurement signals into signal components according to each of the plurality of wavelengths, to obtain a plurality of de-multiplexed measurement signals that are separated according to wavelength,
   wherein the wavelengths comprised within each subset of the plurality of wavelengths is determined using a multiplexing code suitable for enabling their subsequent de-multiplexing according to wavelength.

8. The method of claim 7, wherein the multiplexing code defines a multiplexing matrix such that each one of a row or column of a multiplexing matrix describes each of the subsets of the plurality of wavelengths.

9. The method of claim 8, wherein the de-multiplexing step is performed by application of a de-multiplexing matrix, having a form such that the product of the multiplexing matrix and the de-multiplexing matrix is an identity matrix.

10. The method of claim 8, wherein the multiplexing matrix comprises a circulant matrix.

11. The method of claim 8, wherein each element of each of the rows or columns of the multiplexing matrix indicates the presence or absence of a particular one of the plurality of wavelengths in each subset of the plurality of wavelengths.

12. The method of claim 7, wherein the multiplexing code is based on one of a Hadamard code, a uniformity redundant array code, or a code based on Hadamard matrices or S-matrices.

13. A method for inspecting a structure on a substrate with measurement radiation comprising a plurality of wavelengths, the method comprising:
   performing a plurality of measurement acquisitions of the structure, each measurement acquisition being performed using measurement radiation comprising a different subset of the plurality of wavelengths, to obtain a plurality of multiplexed measurement signals; and
   de-multiplexing the plurality of multiplexed measurement signals into signal components according to each of the plurality of wavelengths, to obtain a plurality of de-multiplexed measurement signals which are separated according to wavelength,
   wherein each subset of the plurality of wavelengths numbers more than one and fewer than the number of the plurality of wavelengths.

14. A non-transitory computer program product comprising machine-readable instructions for causing a processor to cause the performance of the method of claim 1.

* * * * *